United States Patent
Yang

(10) Patent No.: US 9,570,183 B1
(45) Date of Patent: Feb. 14, 2017

(54) METHOD AND CONTROLLER FOR MANAGING MEMORY DEVICE

(71) Applicant: Silicon Motion Inc., Hsinchu County (TW)

(72) Inventor: Tsung-Chieh Yang, Hsinchu (TW)

(73) Assignee: Silicon Motion Inc., Hsinchu County (TW)

( * ) Notice: Subject to any disclaimer, the term of this patent is extended or adjusted under 35 U.S.C. 154(b) by 0 days.

(21) Appl. No.: 15/163,686

(22) Filed: May 25, 2016

(30) Foreign Application Priority Data

Sep. 2, 2015 (TW) .............................. 104128979 A

(51) Int. Cl.
| | |
|---|---|
| *G11C 16/04* | (2006.01) |
| *G11C 16/20* | (2006.01) |
| *G11C 16/26* | (2006.01) |
| *G11C 16/16* | (2006.01) |
| *G11C 16/10* | (2006.01) |
| *G11C 16/08* | (2006.01) |

(52) U.S. Cl.
CPC .............. *G11C 16/20* (2013.01); *G11C 16/08* (2013.01); *G11C 16/10* (2013.01); *G11C 16/16* (2013.01); *G11C 16/26* (2013.01); *G11C 16/0483* (2013.01)

(58) Field of Classification Search
CPC ......... G11C 16/26; G11C 16/20; G11C 16/08; G11C 16/10; G11C 16/16; G11C 16/0483
USPC ...................................................... 365/185.11
See application file for complete search history.

(56) References Cited

U.S. PATENT DOCUMENTS

| | | | | |
|---|---|---|---|---|
| 7,848,155 B2* | 12/2010 | Kim | .................. | G11C 16/3404 365/185.09 |
| 8,493,793 B2* | 7/2013 | Lee | ..................... | G11C 16/0483 365/185.22 |
| 8,677,058 B2* | 3/2014 | Jung | .................... | G06F 12/0246 711/103 |
| 8,971,114 B2* | 3/2015 | Kang | ................. | G11C 16/0483 365/185.11 |
| 2012/0254511 A1 | 10/2012 | Yeh | | |

* cited by examiner

*Primary Examiner* — Pho M Luu
(74) *Attorney, Agent, or Firm* — Winston Hsu; Scott Margo

(57) ABSTRACT

A method for managing a memory device includes: sending a last writing command to a specific non-volatile (NV) memory element in the memory device to write a set of data to a specific block of the specific NV memory element, rather than sending either a first writing command or a second writing command to the specific NV memory element, where these writing commands are utilized for writing to the same location at different times, respectively, in order to guarantee data correctness; and after writing the set of data to the specific block, sending a read command to the specific NV memory element to read stored data of the set of data from the specific block, and checking whether the stored data match the set of data to determine whether the specific block is a bad block.

22 Claims, 5 Drawing Sheets

METHOD AND CONTROLLER FOR MANAGING MEMORY DEVICE

BACKGROUND OF THE INVENTION

1. Field of the Invention

The present invention relates to controlling a flash memory, and more particularly, to a method and controller for managing a memory device.

2. Description of the Prior Art

Developments in flash memories have led to wide application in portable memory devices, such as memory cards conforming to the SD/MMC, CF, MS and XD specifications. How to control flash memories in these portable memory devices has become an important issue.

NAND flash memories include single level cell (SLC) memories and multiple level cell (MLC) memories. Each transistor in an SLC flash memory (which can be viewed as a memory cell) only has two electric charge levels representing logic 0 and logic 1, respectively. The transistors in an MLC flash memory are driven by a higher voltage to record information of multiple bits (e.g. 00, 01, 11, 10) using voltages of different levels. Theoretically, the recording density of the MLC flash memory can be more than twice the recording density of the SLC flash memory. This is good news for the manufacturers of NAND flash memories when considering issues in design and research.

Since the manufacturing cost of MLC flash memories is cheaper than that of SLC flash memories, and as the MLC flash memories may provide a larger capacity in a limited space, applying MLC flash memories to portable memory devices has become more and more popular. The operation of some types of MLC flash memories can be complicated, and introduces various issues. For example, the initialization time of a conventional memory device adopting an MLC flash memory will be greatly increased, making the related cost increase correspondingly. Hence, there is a need for a novel method to enhance the control of memory devices which can improve their initialization efficiency without introducing negative side effects.

SUMMARY OF THE INVENTION

An objective of the present invention is to provide a method for managing a memory device, and an associated memory device and controller, which can solve the above issue.

Another objective of the present invention is to provide a method for managing a memory device and an associated memory device and controller that can improve the operation efficiency of the memory device, and thereby save related costs.

At least one preferred embodiment of the present invention provides a method for managing a memory device. The memory device comprises at least one non-volatile (NV) memory element, wherein each NV memory element comprises a plurality of blocks. The method comprises: sending a last writing command to a specific NV memory element within the NV memory element, to write a set of data to a specific block of the specific NV memory element, rather than sending either a first writing command or a second writing command to the specific NV memory element. The first writing command, the second writing command and the last writing command are used to write a same data into a same location in the NV memory element at different times, respectively, to ensure that the same data is stored correctly. The method further comprises: after the set of data is written to the specific block, sending a read command to the specific NV memory element to read stored data of the set of data from the specific block, and checking whether the stored data matches the set of data to determine whether the specific block is a bad block.

In addition to the above method, the present invention also provides a memory device. The memory device comprises at least one NV memory element, each comprising a plurality of blocks; and a controller, arranged to control the NV memory element. The controller comprises a processing unit for managing the memory device according to a program code embedded in the processing unit or a program code received from outside the processing unit, wherein the controller sends a last writing command to a specific NV memory element within the NV memory element to write a set of data to a specific block in the specific NV memory element, rather than sending either a first writing command or a second writing command to the specific NV memory element. The first writing command, the second writing command, and the last writing command are used to write a same data into a same location in the NV memory element at different times, respectively, to ensure that the same data is stored correctly. After the set of data is written to the specific block, the controller sends a read command to the specific NV memory element to read stored data of the set of data from the specific block, and checks whether the stored data matches the set of data to determine whether the specific block is a bad block.

In addition to the above method, the present invention also provides a controller of a memory device. The memory device comprises at least one NV memory element, each comprising a plurality of blocks. The controller comprises a processing unit, arranged to manage the memory device according to a program code embedded in the processing unit or received from outside the processing unit. The controller sends a last writing command to a specific NV memory element within the NV memory element to write a set of data to a specific block in the specific NV memory element, rather than sending either a first writing command or a second writing command to the specific NV memory element, wherein the first writing command, the second writing command, and the last writing command are arranged to write a same data to a same location in the NV memory element at different times, to ensure that the same data is correctly stored. After the set of data is written to the specific block, the controller sends a reading command to the specific NV memory element to read stored data of the set of data from the specific block, and checks whether the stored data matches the set of data to determine whether the specific block is a bad block.

An advantage provided by the present invention is that, compared with related arts, the method, memory device and controller of the present invention may greatly save the initialization time of the memory device before it leaves the factory, wherein the aforementioned initialization is usually performed at the end of the manufacturing process. Compared with related arts, the present invention may provide a better efficiency, and may save related costs, such as time and human resources.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
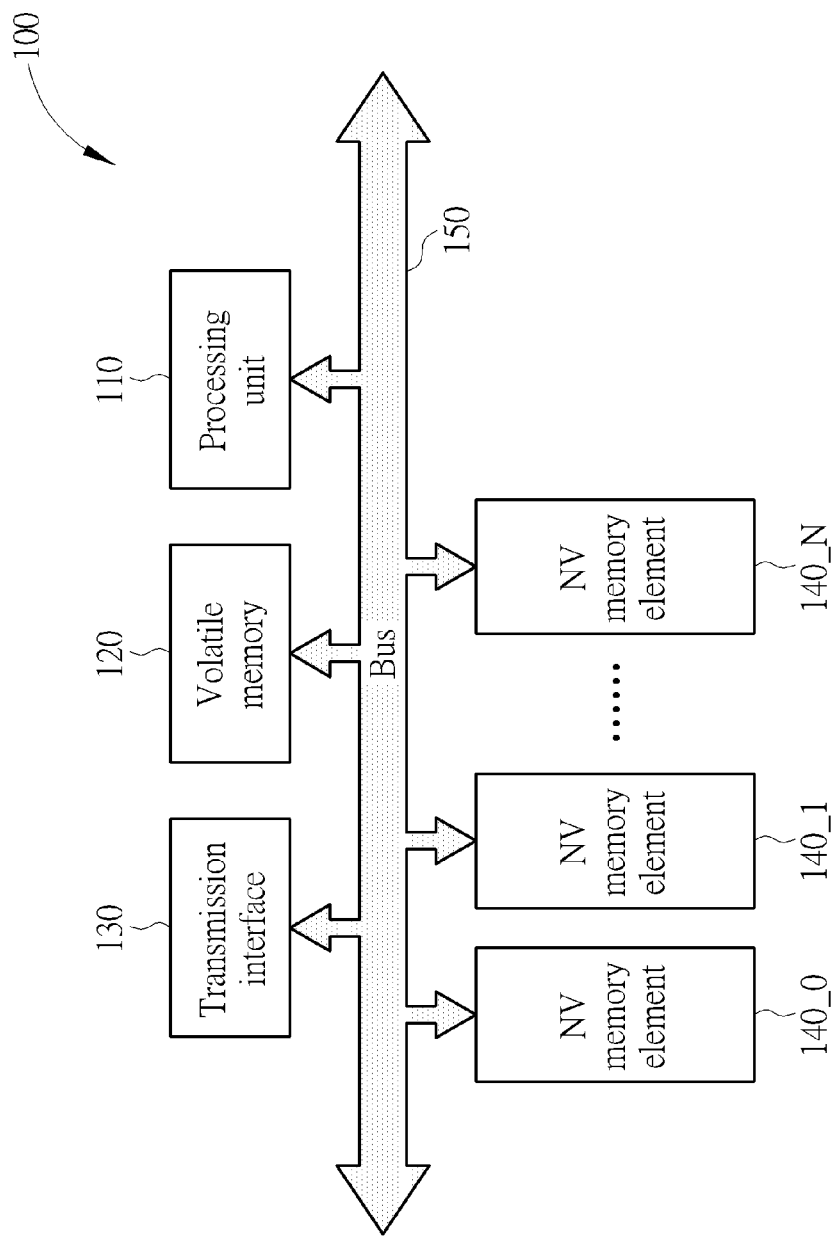
FIG. 1 is a diagram illustrating a memory device according to a first embodiment of the present invention.

FIG. 1 is a diagram illustrating a memory device 100 according to a first embodiment of the present invention. The memory device 100 comprises: a processing unit 110, a volatile memory 120, a transmission interface 130, a plurality of non-volatile (NV) memory elements 140_0, 140_1, . . . , 140_N (wherein N is a positive integer), such as (N+1) flash chips, and a bus 150. Typically, after the transmission interface 130 is coupled to a host (not shown in FIG. 1), the host may utilize the transmission interface 130 to access the memory device 100. The host may represent a personal computer (PC), such as a laptop computer or a desktop computer.

The processing unit 110 may refer to a program code (not shown in the figure) embedded in the processing unit 110 or received from outside the processing unit 110, to manage the memory device 100. The program code may be a hardware code embedded in the processing unit 110, and more particularly, a read-only memory code (ROM code). In another example, the program code may be a firmware code received from outside the processing unit 110. The processing unit 110 is arranged to control the volatile memory 120, the transmission interface 130, the NV memory elements 140_0, 140_1, . . . , 140_N, and the bus 150. In this embodiment, the processing unit 110 may be an Advanced Reduced Instruction Set Computer Machine (Advanced RISC Machine, ARM) processor or an Argonaut RISC Core (ARC) processor. This is merely for illustrative purposes, and not meant to be a limitation of the present invention. According to various modifications of this embodiment, the processing unit 110 may be another type of processor. According to some modifications of this embodiment, the processing unit 110 may receive specific commands from an external electronic device (e.g. a PC) other than the memory device 100, and refer to the specific commands to perform initialization of the memory device 100 before it leaves the factory. In general, the aforementioned initialization is performed immediately after the memory device 100 is manufactured. In this situation, the program executed in the external electronic device associated with a corresponding initialization may be viewed as an example of the aforementioned program code received from outside the processing unit 110.

The volatile memory 120 may be used to store a Global Page Address Linking Table, the data accessed by the host, and information required for accessing the memory device 100. The volatile memory 120 in this embodiment may be a dynamic random access memory (DRAM) or a static random access memory (SRAM). According to various modifications of this embodiment, the volatile memory 120 may be another type of volatile memory. For example, the volatile memory 120 may comprise an SRAM.

According to this embodiment, the transmission interface 130 shown in FIG. 1 is arranged to transmit data and commands between the host and the memory device 100, wherein the transmission interface 130 conforms to a specific communications specification, such as the Serial Advanced Technology Attachment (SATA) specification, the Parallel Advanced Technology Attachment (PATA) specification, or the Universal Serial Bus (USB) specification. The memory device 100 may be a Solid State Drive (SSD) configured in the host, and the specific communications specification may be used to implement some typical communications specifications of the internal communications of the host, such as the SATA specification or the PATA specification. In another example, the memory device 100 is an SSD configured outside the host, and the specific communications specification may be arranged to implement some communications specifications of the external communications of the host, such as the USB specification. According to some modifications of this embodiment, the memory device 100 may be a portable memory device such as a memory card, and the specific communications specification may be arranged to implement some communications specifications of the input/output (I/O) interface of a memory card, such as the Secure Digital (SD) specification or the Compact Flash (CF) specification.

The NV memory elements 140_0, 140_1, . . . , 140_N are arranged to store data, wherein the NV memory elements 140_0, 140_1, . . . , 140_N may be (but are not limited to) NAND flash chips. The bus 150 is arranged to couple and provide communicates between the processing unit 110, the volatile memory 120, transmission interface 130, and the NV memory elements 140_0, 140_1, . . . , 140_N. In this embodiment, in the structure shown in FIG. 1, the elements other than the NV memory elements 140_0, 140_1, . . . , 140_N may be integrated as a controller, and more particularly, an integrated circuit (IC) (e.g. a controller chip), wherein the controller is arranged to control at least one NV memory element in the memory device 100, such as the NV memory elements 140_0, 140_1, . . . , 140_N. Hence, the controller may be viewed as a controller of the memory device 100.

In this embodiment, each NV memory element within the NV memory elements 140_0, 140_1, . . . , 140_N shown in FIG. 1 may comprise a plurality of blocks, wherein the NV memory element 140_n in this embodiment may be realized as a flash chip, and the index n may be an integer within [0, N]. More particularly, each block may comprise a plurality of pages each comprising a plurality of sections. For example, a section may be the smallest reading unit. In other words, during a reading operation, the processing unit 110 may be one or more sections. This is merely for illustrative purposes, and not meant to be a limitation of the present invention.

Figure 2:
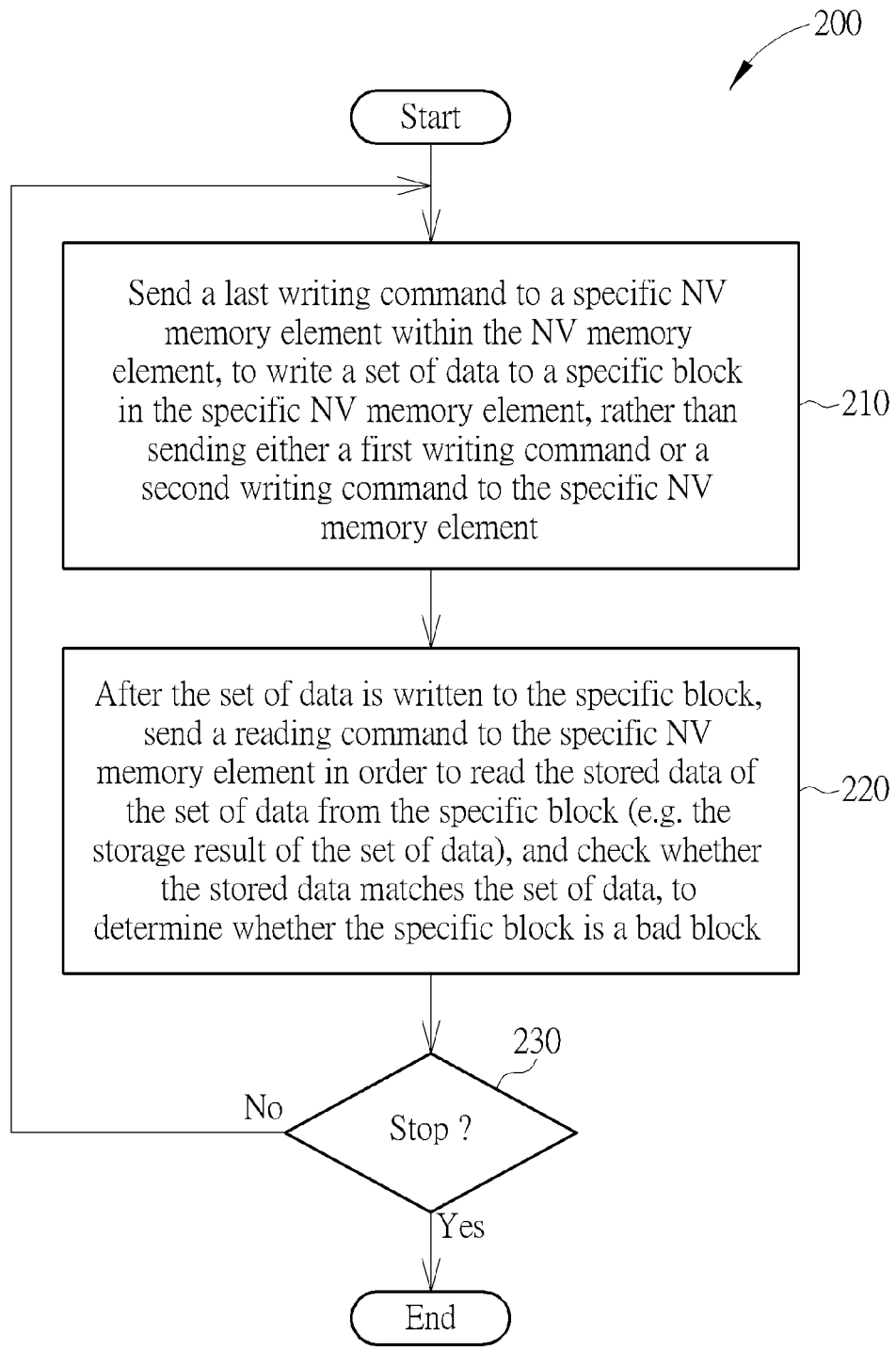
FIG. 2 is a flowchart illustrating a method for managing a memory device according to an embodiment of the present invention.

FIG. 2 is a flowchart illustrating a method 200 for managing a memory device according to an embodiment of the present invention. The method 200 may be applied to the memory device 100 shown in FIG. 1, and more particularly, to the aforementioned controller (e.g. the memory controller executing the program code through the processing unit 110), wherein the controller executing the aforementioned program code is arranged to control the NV memory element such as the NV memory elements 140_0, 140_1, . . . , 140_N shown in FIG. 1. The method 200 is described as follows.

In step 210, the controller sends a last writing command to a specific NV memory element (e.g. the NV memory element 140_n) within the NV memory element, to write a set of data to a specific block in the specific NV memory element, rather than sending either a first writing command or a second writing command to the specific NV memory element, wherein the first writing command, the second writing command, and the last writing command are used to write the same data into the same location of the NV memory element at different times to ensure that the same data is correctly stored. The set of data may comprise data having a predetermined pattern.

In step 220, after the set of data is written to the specific block, the controller sends a reading command to the specific NV memory element in order to read the stored data of the set of data from the specific block (e.g. the storage result of the set of data), and check whether the stored data matches the set of data, to determine whether the specific block is a bad block. When the stored data does not match the set of data, the controller determines the specific block as a bad block, and may record the information that the specific block is a bad block. In another example, when the stored data matches the set of data, the controller determines the specific block as a good block, and may record the information that the specific block is a good block.

In step 230, the controller checks whether the flow should be stopped or not. When it is determined that the flow should be stopped (e.g. all the blocks to be checked are checked), the flow is ended as shown in FIG. 2; otherwise, the flow returns to Step 210. As shown in FIG. 2, operations of Steps 210 and Step 220 may be repeatedly performed to perform the quality scan test block by block. More particularly, the controller may perform the quality scan test on at least a portion (e.g. part or all) of the NV memory element 140_n block by block, until the portion of the NV memory element 140_n is checked. The controller may also perform the quality scan test on a plurality (e.g. part or all) of NV memory elements within the NV memory element block by block, until all blocks in each NV memory element in the plurality of non-volatile memories are checked.

According to this embodiment, under the situation where a memory cell of a block of any NV memory element within the at least one NV memory element is used to store a plurality of bits, the plurality of bits may need to be repeatedly written into the memory cell for a predetermined number of times being more than 1. This is in order to make the memory cell be correctly programmed in the specific NV memory, so that each bit of the plurality of bits is correctly stored in the memory cell for follow-up readings. More particularly, the first writing command is arranged to instruct an inner control circuit of the aforementioned any NV memory element to write the plurality of bits into the memory cell for the first time, the second writing command is arranged to instruct the inner control circuit to write the plurality of bits into the memory cell for a second time, and the last writing command is arranged to instruct the inner control circuit to write the plurality of bits into the memory cell for the last time. For example, when the predetermined times equals three, the last writing command is arranged to instruct the inner control circuit to write the plurality of bits into the memory cell for the third time.

Note that, in this embodiment, when writing the same data, the busy duration of operations of the inner control circuit in response to the first writing command is less than the busy duration of operations of the inner control circuit in response to second writing command. Further, when writing the same data, the busy duration of operations of the inner control circuit in response to the second writing command is less than the busy duration of operations of the inner control circuit in response to the last writing command, wherein the aforementioned busy duration may be determined by detecting a busy signal outputted by the specific NV memory element (e.g. the NV memory element 140_n). More particularly, in a situation where the storage capacity of a memory cell (such as the aforementioned memory cell) in the specific block is larger than 1 bit, the controller may utilize the last writing command to control a state of the memory cell corresponding to a portion of a plurality of programmable states, rather than controlling any of the plurality of programmable states. The plurality of programmable state may comprise eight programmable states corresponding to three bits, and the number of the portion of programmable states is smaller than eight, wherein the total of the eight programmable states corresponds to $2^3$ (i.e. 8).

As mentioned above, the method shown in FIG. 2 may be applied to the memory device 100 shown in FIG. 1, and more particularly, to the aforementioned controller (e.g. a memory controller operated by utilizing the processing unit 110 to execute the aforementioned program code). According to some modifications of this embodiment, under the situation where the processing unit 110 may receive some commands from the external electronic device, the method 200 shown in FIG. 2 may be applied to the external electronic device.

Figure 3:
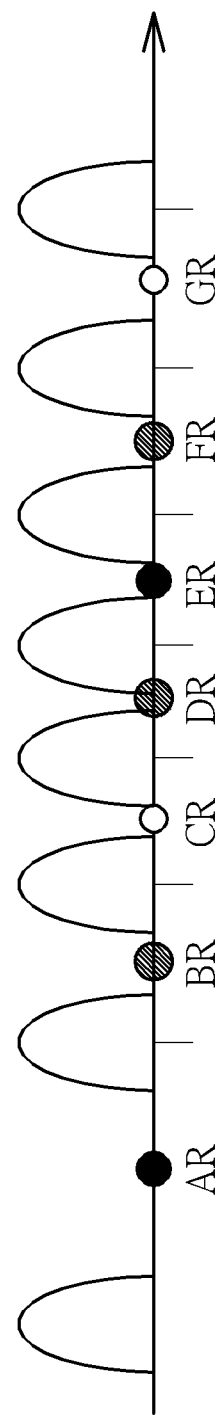
FIG. 3 is a diagram illustrating a control scheme associated with the memory device shown in FIG. 1 according to an embodiment of the present invention.

FIG. 3 is a diagram illustrating a control scheme associated with the memory device 100 shown in FIG. 1 according to an embodiment of the present invention. According to this embodiment, the controller may use the first writing command, the second writing command and/or the last writing command if necessary, without being limited by Step 210. In this situation, the controller may utilize the first writing command, the second writing command and the last writing command to control the memory cell in the specific block to enter any of the plurality of programmable states, such as any of the eight programmable states represented by eight curves in FIG. 3. Note that the controller may refer to a plurality of thresholds {AR, BR, CR, DR, ER, FR, GR} to determine which state of the plurality of programmable states is the current programmable state of the memory cell in the specific block (e.g. the information stored in the memory cell of the specific block), in order to obtain data of all bits (e.g. three bits in this embodiment) stored in the memory cell.

Figure 4:
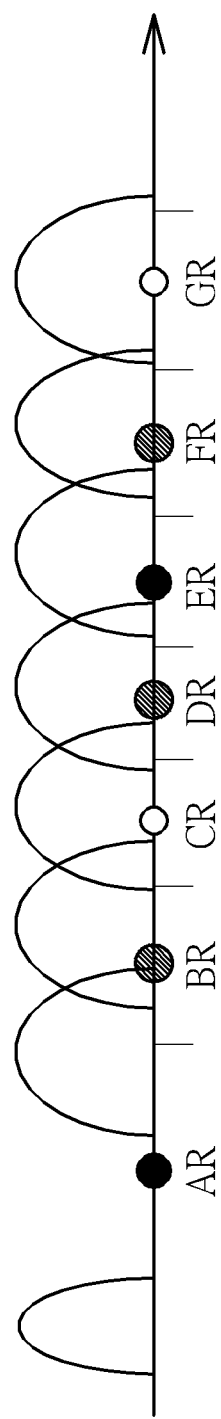
FIG. 4 is a diagram illustrating a control scheme associated with the memory device shown in FIG. 1 according to another embodiment of the present invention.

FIG. 4 is a diagram illustrating a control scheme associated with the memory device 100 shown in FIG. 1 according to another embodiment of the present invention. The controller in this embodiment uses the last writing command only. More specifically, the controller utilizes the last writing command to control the memory cell in the specific block to be in any state of the plurality of programmable states, such as any of the eight programmable states represented by the eight curves shown in FIG. 4. Note that since the controller merely uses the last writing command, at least one portion of the eight curves shown in FIG. 4 is thus overlapped. Hence, the controller cannot directly refer to the thresholds {AR, BR, CR, DR, ER, FR, GR} to determine which of the plurality of programmable states is the current programmable state of the memory cell in the specific block (e.g. the information stored in the memory cell of the specific block), thus cannot obtain data of all bits stored in the memory cell.

Figure 5:
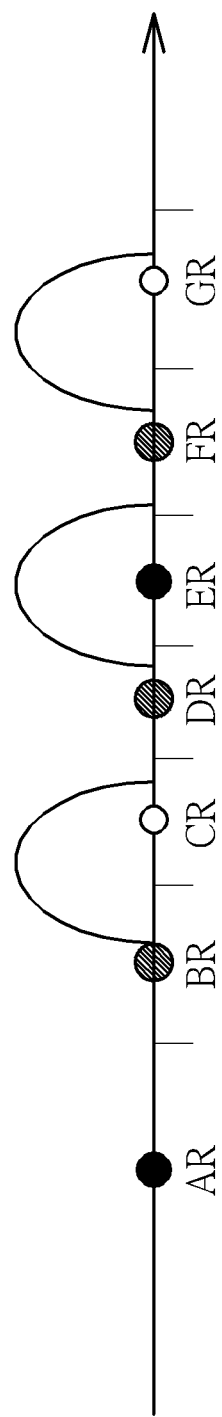
FIG. 5 is a diagram illustrating a control scheme associated with the method shown in FIG. 2 according to an embodiment of the present invention.

FIG. 5 is a diagram illustrating a control scheme associated with the method 200 shown in FIG. 2 according to an embodiment of the present invention. In this embodiment, the controller uses the last writing command only. More specifically, the controller utilizes the last writing command to control the memory cell in the specific block to stay in one state of the portion of the plurality of programmable states only, such as any of the three programmable states represented by the three curves shown in FIG. 5. Note that, according to predetermined relationships between all bits in the memory cell (e.g. there is a total of three bits in this embodiment) and the plurality of programmable states (e.g. there are eight programmable states in this embodiment), the controller may utilize the predetermined pattern in the set of data to control the memory cell in the specific block to correspond to one state of the portion of the plurality of programmable states only, such as any of the three programmable state represented by the three curves shown in FIG. 5. This makes the curves separate from one another. Hence, the controller may refer to at least one portion of the thresholds {AR, BR, CR, DR, ER, FR, GR} to determine which state of the portion of the plurality of programmable states is the current programmable state of the memory cell in the specific block (e.g. the information stored in the memory cell in the specific block), thus obtaining data of all bits (e.g. three bits in this embodiment) stored in the memory cell.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for managing a memory device, the memory device comprising at least one non-volatile (NV) memory element, each NV memory element comprising a plurality of blocks, the method comprising:
    sending a last writing command to a specific NV memory element within the NV memory element, to write a set of data to a specific block of the specific NV memory element, rather than sending either a first writing command or a second writing command to the specific NV memory element, wherein the first writing command, the second writing command and the last writing command are used to write a same data into a same location in the NV memory element at different times, respectively, to ensure that the same data is stored correctly; and
    after the set of data is written to the specific block, sending a read command to the specific NV memory element to read stored data of the set of data from the specific block, and checking whether the stored data matches the set of data to determine whether the specific block is a bad block.

2. The method of claim 1, wherein under a situation where a memory cell of a block of any NV memory element within the at least one NV memory is arranged to store a plurality of bits, the plurality of bits are repeatedly written to the memory cell for a predetermined number of times, to make the memory cell be correctly programmed in the specific NV memory, so that each bit of the plurality of bits is correctly stored in the memory cell for follow-up readings; and the predetermined number of times is larger than 1.

3. The method of claim 2, wherein the first writing command is arranged to instruct an inner control circuit in said any NV memory element within the at least one NV memory to write the plurality of bits into the memory cell for a first time, the second writing command is arranged to instruct the inner control circuit to write the plurality of bits into the memory cell for a second time, and the last writing command is arranged to instruct the inner control circuit to write the plurality of bits into the memory cell for a last time.

4. The method of claim 3, wherein the predetermined number of times is equal to 3; and the last writing command is arranged to instruct the inner control circuit to write the plurality of bits into the memory cell for a third time.

5. The method of claim 3, wherein regarding writing the same data, a busy duration of operations of the inner control circuit in response to the first writing command is less than a busy duration of operations of the inner control circuit in response to the second writing command, and the busy duration of operations of the inner control circuit in response to the second writing command is less than a busy duration of operations of the inner control circuit in response to the last writing command.

6. The method of claim 1, wherein the storage capacity of a memory cell in the specific block is larger than 1 bit.

7. The method of claim 6, further comprising:
    utilizing the last writing command to control the memory cell to be in a state of a portion of a plurality of programmable states only, rather than any of the plurality of programmable states.

8. The method of claim 1, wherein the step of checking whether the stored data matches the set of data to determine whether the specific block is a bad block comprises:
    when the stored data does not match the set of data, determining the specific block as a bad block.

9. A memory device, comprising:
    at least one non-volatile (NV) memory element, each comprising a plurality of blocks; and
    a controller, arranged to control the NV memory element, the controller comprising a processing unit for managing the memory device according to a program code embedded in the processing unit or a program code received from outside the processing unit, wherein the controller sends a last writing command to a specific NV memory element within the NV memory element to write a set of data to a specific block in the specific NV memory element, rather than sending either a first writing command or a second writing command to the specific NV memory element, wherein the first writing command, the second writing command, and the last writing command are used to write a same data into a same location in the NV memory element at different times, respectively, to ensure that the same data is stored correctly;
    wherein after the set of data is written to the specific block, the controller sends a read command to the specific NV memory element to read stored data of the set of data from the specific block, and checks whether the stored data matches the set of data to determine whether the specific block is a bad block.

10. The memory device of claim 9, wherein under the situation where a memory cell of a block of any NV memory element within the at least one NV memory is arranged to store a plurality of bits, the plurality of bits are repeatedly written to the memory cell for a predetermined number of times, to make the memory cell be correctly programmed in the specific NV memory, so that each bit of the plurality of bits is correctly stored in the memory cell for follow-up readings; and the predetermined number of times is larger than 1.

11. The memory device of claim 10, wherein the first writing command is arranged to instruct an inner control circuit in said any NV memory element within the at least one NV memory to write the plurality of bits into the memory cell for a first time, the second writing command is arranged to instruct the inner control circuit to write the plurality of bits into the memory cell for a second time, and the last writing command is arranged to instruct the inner control circuit to write the plurality of bits into the memory cell for a last time.

12. The memory device of claim 11, wherein the predetermined number of times is equal to 3; and the last writing command is arranged to instruct the inner control circuit to write the plurality of bits into the memory cell for a third time.

13. The memory device of claim 11, wherein when writing the same data, a busy duration of operations of the inner control circuit in response to the first writing command is less than a busy duration of operations of the inner control circuit in response to the second writing command, and the busy duration of operations of the inner control circuit in response to the second writing command is less than a busy duration of operations of the inner control circuit in response to the last writing command.

14. The memory device of claim 9, wherein the storage capacity of a memory cell in the specific block is larger than 1 bit.

15. The memory device of claim 14, wherein the controller utilizes the last writing command to control the memory cell to be in a state of a portion of a plurality of programmable states only, rather than any of the plurality of programmable states.

16. A controller of a memory device, the memory device comprising at least one non-volatile (NV) memory element, each comprising a plurality of blocks, the controller comprising:
a processing unit, arranged to manage the memory device according to a program code embedded in the processing unit or received from outside the processing unit, wherein the controller sends a last writing command to a specific NV memory element within the NV memory element to write a set of data to a specific block in the specific NV memory element, rather than sending either a first writing command or a second writing command to the specific NV memory element, wherein the first writing command, the second writing command, and the last writing command is arranged to write a same data to a same location in the NV memory element at different times, to ensure that the same data is correctly stored;
wherein after the set of data is written to the specific block, the controller sends a reading command to the specific NV memory element to read stored data of the set of data from the specific block, and checks whether the stored data matches the set of data to determine whether the specific block is a bad block.

17. The controller of claim 16, wherein under a situation where a memory cell of a block of any NV memory element within the at least one NV memory is arranged to store a plurality of bits, the plurality of bits are repeatedly written to the memory cell for a predetermined number of times, to make the memory cell be correctly programmed in the specific NV memory, so that each bit of the plurality of bits is correctly stored in the memory cell for follow-up readings; and the predetermined number of times is larger than 1.

18. The controller of claim 17, wherein the first writing command is arranged to instruct an inner control circuit in said any NV memory element within the at least one NV memory to write the plurality of bits into the memory cell for a first time, the second writing command is arranged to instruct the inner control circuit to write the plurality of bits into the memory cell for a second time, and the last writing command is arranged to instruct the inner control circuit to write the plurality of bits into the memory cell for a last time.

19. The controller of claim 18, wherein the predetermined number of times is equal to 3; and the last writing command is arranged to instruct the inner control circuit to write the plurality of bits into the memory cell for a third time.

20. The controller of claim 18, wherein when writing the same data, a busy duration of operations of the inner control circuit in response to the first writing command is less than a busy duration of operations of the inner control circuit in response to the second writing command, and the busy duration of operations of the inner control circuit in response to the second writing command is less than a busy duration of operations of the inner control circuit in response to the last writing command.

21. The controller of claim 16, wherein the storage capacity of a memory cell in the specific block is larger than 1 bit.

22. The controller of claim 21, wherein the controller utilizes the last writing command to control the memory cell to be in a state of a portion of a plurality of programmable states only, rather than any of the plurality of programmable states.

* * * * *